(12) United States Patent
Tseng

(10) Patent No.: US 7,342,784 B2
(45) Date of Patent: Mar. 11, 2008

(54) COOLING METHOD AND DEVICE FOR AN ELECTRONIC COMPONENT

(75) Inventor: Keng-Wen Tseng, Jhonghe (TW)

(73) Assignee: Cimaker Technology Co., Ltd. (TW)

( * ) Notice: Subject to any disclaimer, the term of this patent is extended or adjusted under 35 U.S.C. 154(b) by 2 days.

(21) Appl. No.: 11/439,282

(22) Filed: May 24, 2006

(65) Prior Publication Data
US 2007/0274037 A1 Nov. 29, 2007

(51) Int. Cl.
  H05K 7/20 (2006.01)
  F25D 9/00 (2006.01)
  F25D 23/12 (2006.01)
(52) U.S. Cl. ............... 361/691; 361/695; 361/717; 62/259.2; 62/401
(58) Field of Classification Search ........ 361/688–691, 361/694–695, 717–718, 722; 62/259.2, 401
See application file for complete search history.

(56) References Cited

U.S. PATENT DOCUMENTS 3,843,910 A * 10/1974 Ringuet .................. 361/696
5,566,377 A * 10/1996 Lee ....................... 361/695
6,702,545 B2 * 3/2004 Scholten .................... 415/1
7,168,918 B2 * 1/2007 Balan et al. ............ 415/208.2

* cited by examiner

Primary Examiner—Jayprakash Gandhi
Assistant Examiner—Robert J. Hoffberg
(74) Attorney, Agent, or Firm—Hershkovitz & Associates; Abe Hershkovitz

(57) ABSTRACT

A cooling device for electronic components has a main body, a motor, an adaptor tube, a shaft, a valve assembly, a reservoir, and a delivery tube. The motor is mounted in the main body. The adaptor tube is mounted between the main body and the reservoir and is gradually smaller in diameter from the main body to the reservoir. The shaft connects to the motor, extends into the adaptor tube and has multiple fan blades corresponding to the inside diameter of the adaptor tube. The fan blades blow the air through the adaptor tube into the reservoir to pressurize the air. The pressurized air flows through the delivery tube to contact the electronic component and equalizes to correspond to the atmosphere. The equalizing process of the pressurized air absorbs heat from the electronic component as it expands to cool the electronic component.

16 Claims, 6 Drawing Sheets

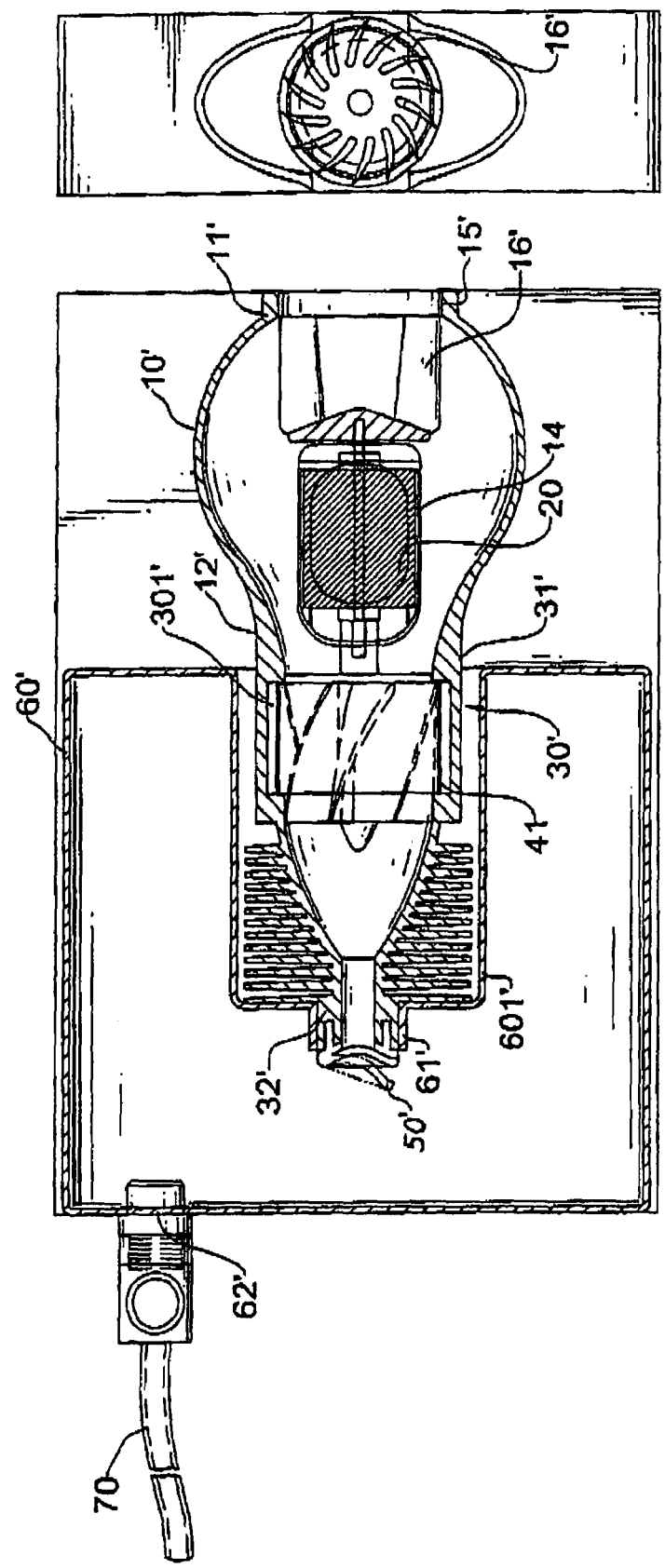

COOLING METHOD AND DEVICE FOR AN ELECTRONIC COMPONENT

BACKGROUND OF THE INVENTION

1. Field of the Invention

The present invention relates to a cooling method and device for an electronic component, especially to a cooling method and device that use pressurized air to cool an electronic component.

2. Description of the Prior Art

Electronic components such as central processing units (CPU), main boards and graphics cards generate great amounts of heat when they are operating. High temperatures cause the processing speed of electronic components to slow down and can even cause damage to the electronic components, therefore almost all electronic components have at least one cooling device. A conventional cooling device is mounted on the electronic component and comprises a body and a fan. The body has multiple fins formed thereon and is attached to the surface of the electronic component. The fan is attached to the body. However, the fan does not cool the electronic component directly. Heat generated by the electronic component is conducted to the body. The fan then blows air to cool the body. Therefore, the cooling efficiency is not very good. Furthermore, as the processing speeds of electronic components become faster, electronic components will generate even more heat. Using a conventional cooling device is not sufficient to cool an electronic component.

To overcome the shortcomings, the present invention provides a cooling method and device that can cool an electronic component directly to mitigate or obviate the aforementioned problems.

SUMMARY OF THE INVENTION

The main objective of the present invention is to provide a cooling method and device that can cool an electronic component directly. The cooling device for an electronic component has a main body, a motor, an adaptor tube, a shaft, a valve assembly, a reservoir, and a delivery tube. The motor is mounted in the main body. The adaptor tube is mounted between the main body and the reservoir. The diameter of the adaptor tube is gradually smaller from the main body to the reservoir. The shaft connects to the motor, extends into the adaptor tube and has multiple fan blades corresponding to the diameter of the adaptor tube. The fan blades on the shaft blow air through the adaptor tube into the reservoir to pressurize the air. The pressurized air flows through the delivery tube to contact the electronic component. When the pressurized air is exhausted into the atmosphere, the pressurized air equalizes to 1 atm to the pressure of the atmosphere. The equalizing process of the pressurized air absorbs heat from the electronic component to cool the electronic component.

Other objectives, advantages and novel features of the invention will become more apparent from the following detailed description when taken in conjunction with the accompanying drawings.

BRIEF DESCRIPTION OF THE DRAWINGS

FIG. 6 is a side view in partial section of a second embodiment of a cooling device for an electronic component in accordance with the present invention;

FIG. 7 is an end view of the cooling device in FIG. 8;

DETAILED DESCRIPTION OF THE PREFERRED EMBODIMENTS

Figure 1:
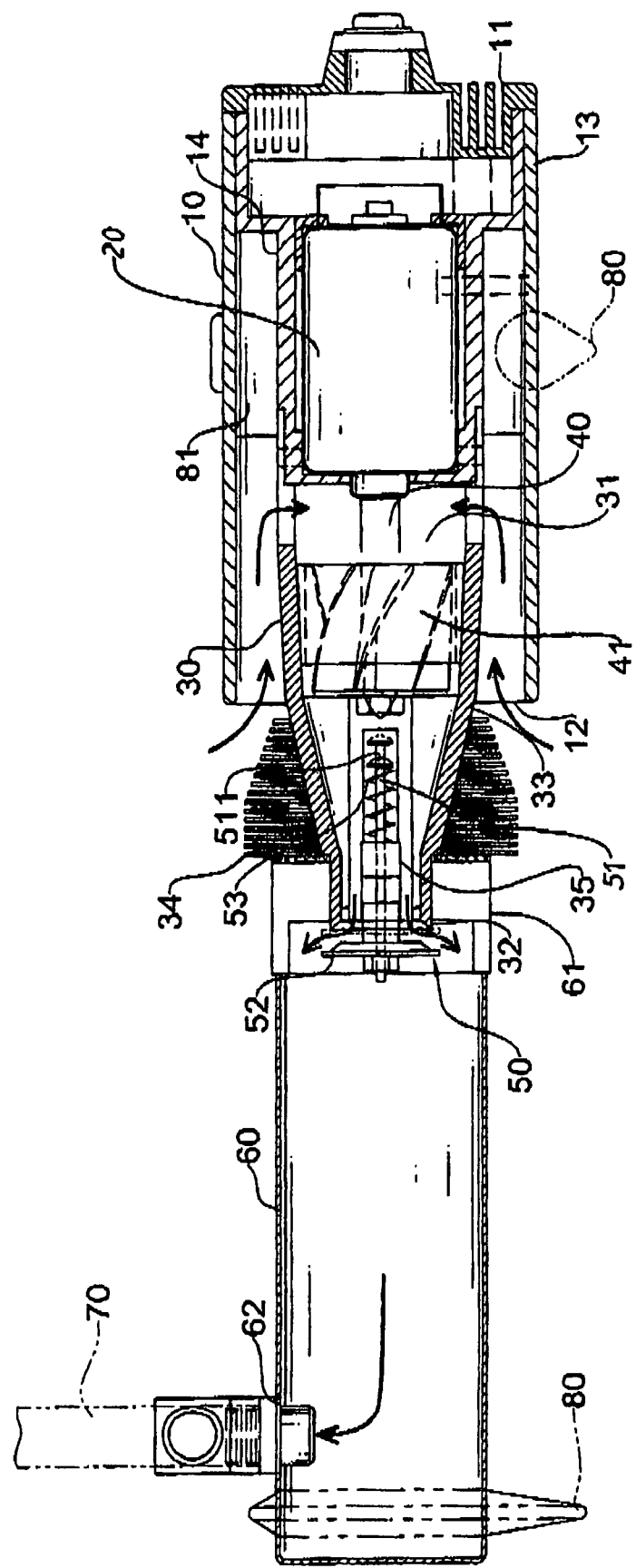
FIG. 1 is a side view in partial section of a first embodiment of a cooling device for an electronic component in accordance with the present invention.
Figure 5:
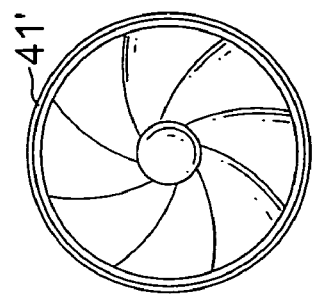
FIG. 5 is an end view of the exiting fan assembly in FIG. 4.
Figure 4:
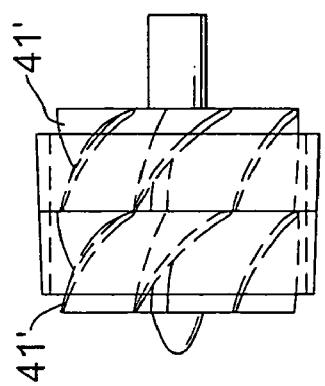
FIG. 4 is a side view of another embodiment of an exiting fan assembly of the cooling device in FIG. 1.
Figure 3:
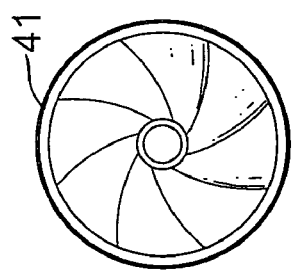
FIG. 3 is an end view of the exiting fan assembly in FIG. 2.
Figure 2:
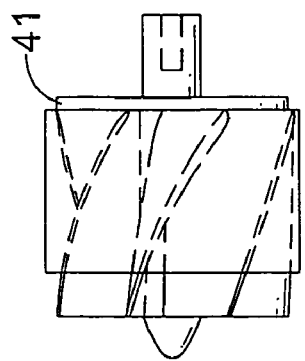
FIG. 2 is a side view of an exiting fan assembly of the cooling device in FIG. 1.

With reference to FIG. 1, a cooling device for an electronic component in accordance with the present invention comprises a main body (10), a motor (20), an adaptor tube (30), a shaft (40), a valve assembly (50), a reservoir (60), a delivery tube (70), multiple optional vibration-dampening supports (80) and optional noise-dampening insulation (81).

The main body (10) has a distal end (11), a proximal end (12), an inner space, a sidewall (13) and an optional bracket (14). The bracket (14) is formed in the inner space of the main body (10).

The motor (20) is mounted securely in the main body (10), and may be attached to the bracket (14) in the main body (10).

The adaptor tube (30) is mounted securely in the proximal end (12) of the main body (10), corresponds to the motor (20) and has an inlet (31), an outlet (32), a diameter, a sidewall (33), multiple optional fins (34) and an optional holder (35). The diameter of the adaptor tube (30) is gradually smaller from the inlet (31) to the outlet (32). The fins (34) are formed around the outside of the sidewall (33) of the adaptor tube (30) near the outlet (32). The temperature of the air passing through the adaptor tube (30) may be raised, so the fins (34) help to lower the temperature. The holder (35) is formed in the outlet (32) of the adaptor tube (30).

With further reference to FIGS. 2-5, the shaft (40) connects to and is rotated by the motor (20), extends axially into the adaptor tube (30) from the inlet (31) and has a sidewall and at least one exiting fan assembly (41, 41'). The shaft (40) may have two exiting fan assemblies (41') aligning to each other. Each fan assembly (41, 41') is mounted on the sidewall of the shaft (40) and may be fastened securely on the sidewall of the shaft (40) or may be formed on the sidewall of the shaft (40). Each fan assembly (41, 41') has multiple fan blades. Each fan blade has a length. The length of the fan blade corresponds to the inside diameter of the adaptor tube (30) to prevent backflow.

The valve assembly (50) is mounted in the outlet (32) of the adaptor tube (30) to allow the pressurized air to be released out of the adaptor tube (30) from the outlet (32) and may have a valve stem (51), a valve disk (52) and a spring (53). The valve stem (51) is axially mounted movably through the holder (35) in the adaptor tube (30) and has an inner end, an outer end and a cap (511). The cap (511) is formed on the inner end of the valve stem (51). The valve disk (52) is formed on the outer end of the valve stem (51) and corresponds to and selectively seals the outlet (32) of the adaptor tube (30). The spring (53) is mounted around the valve stem (51) and is mounted between and biases the holder (35) and the cap (511).

The reservoir (60) is mounted around the adaptor tube (30), covers the outlet (32) of the adaptor tube (30) and has an inlet (61), an outlet (62) and an outer wall. The inlet (61) of the reservoir (60) communicates with the outlet (32) of the adaptor tube (30).

The delivery tube (70) connects to the outlet (62) of the reservoir (60). The vibration-dampening supports (80) are attached to or mounted around the sidewalls (13) of the main body (10) and the reservoir (60). Because the cooling device may vibrate and shake during operating, the vibration-dampening supports (80) isolate the cooling device from the object to which it is attached, such as a computer, ground, etc., to prevent unnecessary vibration.

The noise-dampening insulation (81) is mounted around the motor (20) in the main body (10). The motor (20) may make noise during operation, so the noise-dampening insulation (81) helps to keep the noise level down.

Figure 11:
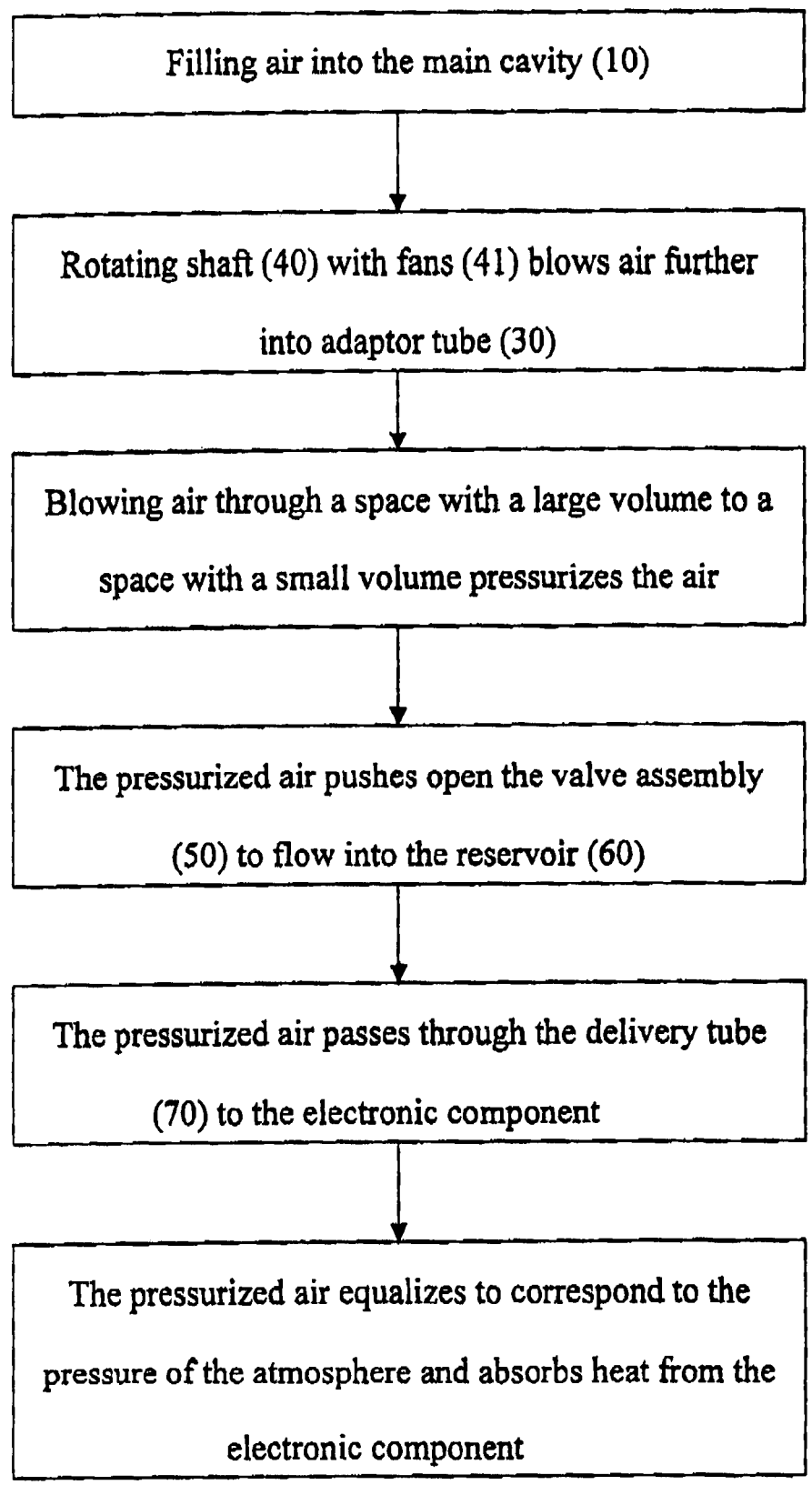
FIG. 11 is a logic diagram of a cooling method for an electronic component in accordance with the present invention.

With further reference to FIG. 11, a cooling method for an electronic component in accordance with the present invention uses pressurized air to cool the electronic component. The air flows into the main body (10) and into the adaptor tube (30) from the inlet (31) of the adaptor tube (30). The motor (20) rotates the shaft (40) and the fan assembly (41) on the shaft (40) to blow the air from the inlet (31) of the adaptor tube (30) to the outlet (32) of the adaptor tube (30). Because the diameter of the adaptor tube (30) becomes gradually smaller from the inlet (31) to the outlet (32) of the adaptor tube (30) and the fan assembly (41) blows the air to provide the air energy, the air is pressurized. In a preferred embodiment, the air is pressurized to 3 atmospheres (atm). When the air is pressurized high enough to open the valve disk (52), the pressurized air passes through the outlet (32) of the adaptor tube (30) into the reservoir (60). The pressurized air passes through the outlet (62) of the reservoir (60) into the delivery tube (70). The pressurized air passes through the delivery tube (70) to contact the electronic component. Because the pressurized air goes into the atmosphere, the pressure of the pressurized air equalizes to 1 atm to correspond with the pressure of the atmosphere. The equalizing process needs energy to expand the air molecule so the pressurized air absorbs heat from the electronic component to cool the electronic component.

Figure 8:
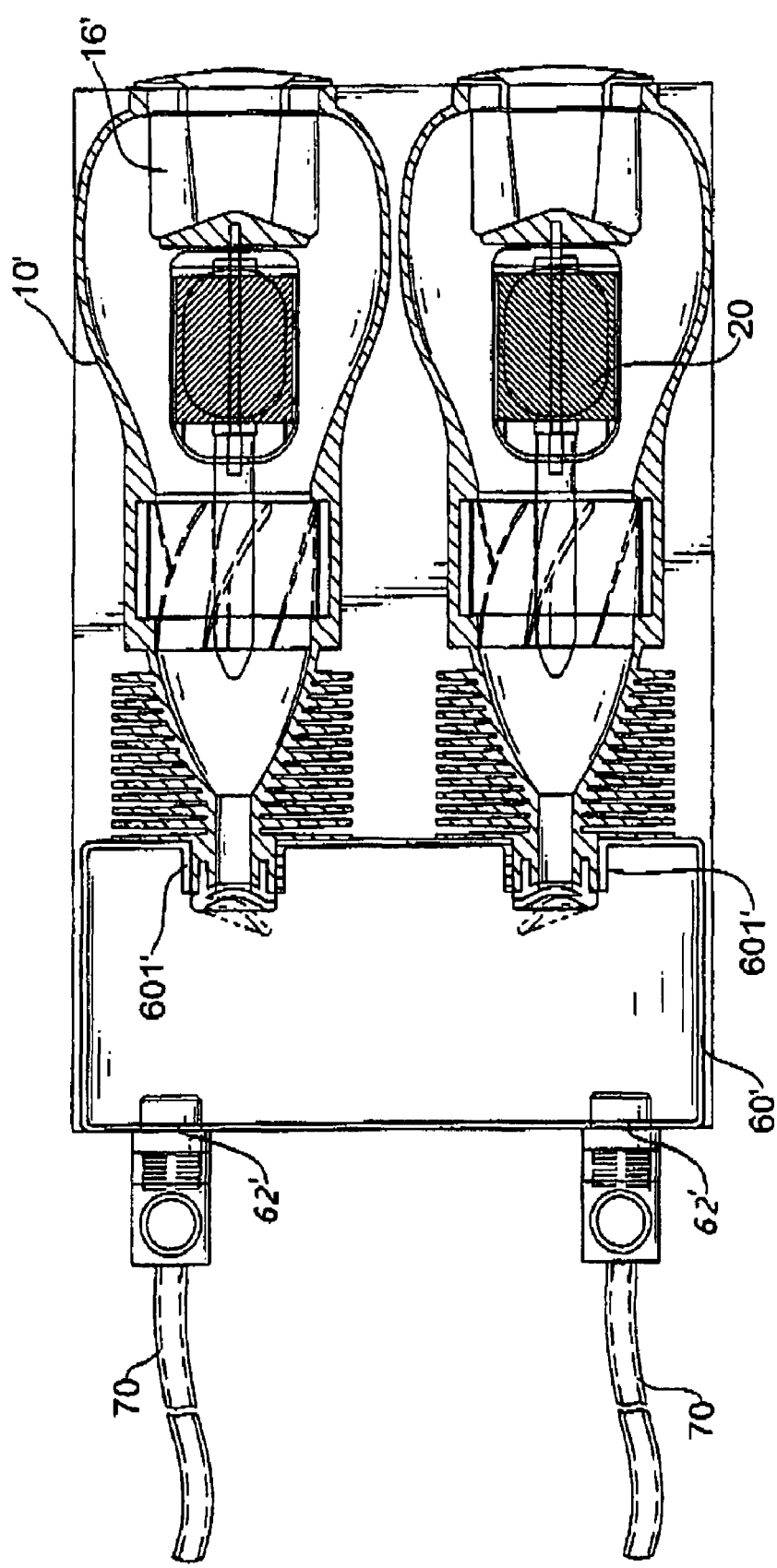
FIG. 8 is a side view in partial section of a third embodiment of a cooling device for an electronic component in accordance with the present invention.
Figure 10:
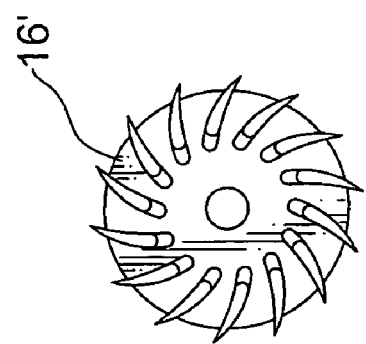
FIG. 10 is an end view of the entering fan in FIG. 9.
Figure 9:
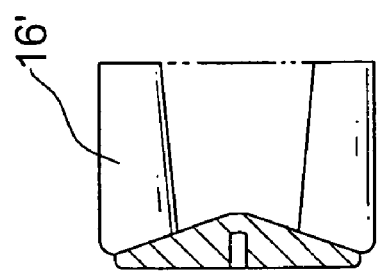
FIG. 9 is a side view of an entering fan of the cooling device in FIGS. 7 and 8.

With further reference to FIGS. 6-10, the main body (10') has a through hole (15') and an entering fan (16'). The through hole (15') is formed in the distal end (11') of the main body (10'). The entering fan (16') is mounted in the through hole (15') and connects to and is driven by the motor (20) to inhale air into the main body (10'). The inlet (31') of the adaptor tube (30') is formed on the proximal end (12') of the main body (30') to integrate the adaptor tube (30') with the main body (10'). The adaptor tube (30') has an annular recess (301'). The annular recess (301') is formed in the adaptor tube (30') and corresponds to the exiting fan assembly (41) to receive the exiting fan assembly (41) to prevent backflow. The valve assembly (50') may have two valve disks mounted pivotally in the outlet (32') of the adaptor tube (30') (as shown in FIG. 8). The reservoir (60') has a recess (601') or multiple recesses (601') formed in the inlet (61') of the reservoir (60') to receive one or multiple outlets (32') of one or multiple adaptor tubes (30'). One or multiple delivery tubes (70) connect to the outlet (62') of the reservoir (60') to contact to every desired electronic component.

The advantage of the cooling device and the cooling method is that the electronic component is cooled directly, with the pressurized air blowing on the electronic component. The pressurized air absorbs heat when the pressurized air equalizes and expands. Therefore, the pressurized air can cool the electronic component directly and efficiently. Furthermore, the main body (10) and the reservoir (60) are mounted outside of a computer and the delivery tube (70) extends into the computer to connect to the electronic component in the computer. Therefore, the air flowing into the main body (10) is at room temperature, which is usually much lower than the temperature of the electronic component in operation.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A cooling device for an electronic component comprising:
   a main body having
      a distal end,
      a proximal end,
      an inner space and
      a sidewall;
   a motor mounted securely in the main body;
   at least one adaptor tube connected to the proximal end of the main body, corresponding to the motor and having
      an inlet;
      an outlet;
      a diameter gradually smaller from the inlet to the outlet; and
      a sidewall;
   a shaft connecting to and rotated by the motor, extending axially into the adaptor tube from the inlet of the adaptor tube and having
      a sidewall; and
      at least one exiting fan assembly being on the sidewall of the shaft, and each fan assembly having multiple fan blades wherein each fan blade has a length corresponding to an inside diameter of the adaptor tube;
   a valve assembly mounted in the outlet of the adaptor tube and adapted to allow pressurized air to be released from the adaptor tube through the outlet;
   a reservoir mounted around the adaptor tube, covering the outlet of the adaptor tube and having
      an inlet communicating with the outlet of the adaptor tube;
      an outlet; and
      an outer wall; and
   at least one delivery tube connecting to the outlet of the reservoir.

2. The cooling device as claimed in claim 1, wherein
   the adaptor tube has a holder formed in the outlet of the adaptor tube; and
   the valve assembly comprises
   a valve stem axially mounted movably through the holder in the adaptor tube and having
      an inner end;

an outer end; and
a cap formed on the inner end of the valve stem;
a valve disk formed on the outer end of the valve stem and corresponding to and selectively sealing the outlet of the adaptor tube; and
a spring mounted around the valve stem and mounted between and biasing the holder and the cap.

3. The cooling device as claimed in claim 2, wherein
the main body has a bracket formed in the inner space of the main body; and
the motor is attached to the bracket in the main body.

4. The cooling device as claimed in claim 3, wherein the adaptor tube has multiple fins formed around the sidewall of the adaptor tube near the outlet.

5. The cooling device as claimed in claim 4, further comprising
multiple vibration-dampening supports attached to the sidewalls of the main body and the reservoir; and
a noise-dampening insulation mounted around the motor in the main body.

6. The cooling device as claimed in claim 4, further comprising
multiple vibration-dampening supports mounted around the sidewalls of the main body and the reservoir; and
a noise-dampening insulation mounted around the motor in the main body.

7. The cooling device as claimed in claim 6, wherein the shaft has two exiting fan assemblies aligned with each other.

8. The cooling device as claimed in claim 1, wherein
the main body has a bracket formed in the inner space of the main body; and
the motor is attached to the bracket in the main body.

9. The cooling device as claimed in claim 1, wherein the adaptor tube has multiple fins formed around the sidewall of the adaptor tube near the outlet.

10. The cooling device as claimed in claim 1, further comprising
multiple vibration-dampening supports attached to the sidewalls of the main body and the reservoir; and
a noise-dampening insulation mounted around the motor in the main body.

11. The cooling device as claimed in claim 1, further comprising
multiple vibration-dampening supports mounted around the sidewalls of the main body and the reservoir; and
a noise-dampening insulation mounted around the motor in the main body.

12. The cooling device as claimed in claim 1, wherein the shaft has two exiting fan assemblies aligned with each other.

13. The cooling device as claimed in claim 1, wherein the main body has
a through hole formed in the distal end of the main body; and
an entering fan mounted in the through hole and connecting to and driven by the motor;
the inlet of the adaptor tube is formed on the proximal end of the main body to integrate the adaptor tube with the main body;
the adaptor tube has an annular recess formed in the adaptor tube and corresponding to the exiting fan assembly to receive the exiting fan assembly;
the valve assembly has a valve disk mounted pivotally in the outlet of the adaptor tube; and
the reservoir has at least one recess formed in the inlet of the reservoir to receive the outlet of the adaptor tube.

14. The cooling device as claimed in claim 13, wherein
the reservoir has multiple recesses; and
the cooling device further has multiple adaptor tubes received in the recesses of the reservoir.

15. The cooling device as claimed in claim 14, further comprising multiple delivery tubes connecting to the outlet of the reservoir.

16. The cooling device as claimed in claim 13, further comprising multiple delivery tubes connecting to the outlet of the reservoir.

* * * * *